United States Patent [19]
Creighton

[11] Patent Number: 5,818,575
[45] Date of Patent: Oct. 6, 1998

[54] LAMP STABLITY DIAGNOSTIC SYSTEM

[75] Inventor: Michael A. Creighton, Danbury, Conn.

[73] Assignee: SVG Lithography Systems, Inc., Wilton, Conn.

[21] Appl. No.: 835,845

[22] Filed: Apr. 30, 1997

[51] Int. Cl.[6] .................................................. G01J 1/42
[52] U.S. Cl. .......................... 356/222; 356/414; 356/408; 356/425
[58] Field of Search ................................ 356/222, 406, 356/414, 408, 425, 419

[56] References Cited

U.S. PATENT DOCUMENTS 5,373,216  12/1994  Dakin ........................................ 315/248
5,680,220  10/1997  Delignieves .............................. 356/406

Primary Examiner—Frank G. Font
Assistant Examiner—Reginald A. Ratliff
Attorney, Agent, or Firm—Fattibene & Fattibene; Paul A. Fattibene; Arthur T. Fattibene

[57] ABSTRACT

Two detectors are effectively positioned at a predetermined lateral position in a rectangular illumination field at a wafer plane. The ratio of the signals from the two detectors is calculated. This ratio is indicative of the quality of the illumination field and any lamp instability which may effect the illumination field, and therefore image quality. In a photolithographic device, a short arc mercury xenon lamp provides illumination for projecting the image of a reticle onto a photosensitive resist covered substrate or wafer. The desired illumination intensity profile is sensitive to lamp instability. This instability may alter the desired illumination intensity profile which may adversely effect image quality, and therefore the resulting product. The ratio of the signals received from predetermined locations laterally along the illumination intensity profile improves the detection of unstable lamps. The detectors are positioned at locations of relatively steep slope in the illumination intensity profile thereby increases sensitivity.

17 Claims, 4 Drawing Sheets

LAMP STABLITY DIAGNOSTIC SYSTEM

FIELD OF THE INVENTION

The present invention relates in general to photolithography or microlithography as used in the manufacture of semiconductor devices, and more particularly in detecting lamp stability of an arc lamp used as an illumination source therewith.

BACKGROUND OF THE INVENTION

In the manufacture of semiconductor wafers, photolithography or microlithography is generally used. In some microlithography systems, a short arc lamp which may be a mercury xenon, (Hg(Xe)), arc lamp is used as an illumination source for projecting the image of a reticle through projection optics onto a photosensitive resist covered wafer. Generally, a small area, approximately 0.05 cm², of the arc lamp is used to provide an illumination field for projecting the image of a reticle onto the wafer. The illumination field is generally in the form of a rectangle having a predetermined lateral illumination intensity profile. Maintaining the predetermined illumination intensity profile is often desirable in achieving an acceptable image quality at the wafer plane. However, the arc lamp sometimes becomes unstable effecting the illumination field. Accordingly, various detectors have been developed to monitor the arc lamp. Generally, these detectors observe the arc lamp directly and monitor any instability or change in the arc lamp itself. However, changes in the arc lamp itself may or may not adversely effect the illumination field that is received at the wafer. Therefore, while prior detectors have often indicated unstable lamp characteristics, the detected instability may not actually adversely effect the illumination field, and therefore image quality at the wafer. Additionally, various changes in the lamp that may not have been detected by prior detectors could result in an undesirable illumination field at the wafer which could effect image quality. Therefore, there is a need in microlithographic systems utilizing an arc lamp based illumination system to more accurately monitor the arc lamp to determine whether or not changes or instability in the arc lamp will actually effect the illumination field at the wafer, and therefore image quality.

SUMMARY OF THE INVENTION

The present invention is a lamp stability detection system that utilizes a detector array positioned laterally across a rectangular illumination field, at a plane of the wafer or at a conjugate of the image plane at the wafer. The detector array samples the illumination intensity at two locations separated by a predetermined distance near a steep slope of an illumination intensity profile laterally across the illumination field. The ratio of the signals from the two detectors is calculated and monitored. A variation in the lamp which causes the predetermined illumination intensity profile to change results in the ratio of the two detector signals to change. This change is detected by a system controller which, when the change falls outside of a predetermined limit, will provide a message to an operator to check the lamp or stop further processing of any wafers.

Accordingly, it is an object of the present invention to monitor an illumination field at a wafer plane or its conjugate.

It is a further object of the present invention to detect unstable lamps used in photolithography.

It is an advantage of the present invention that illumination problems are detected during processing which may effect image quality.

It is an advantage of the present invention that lamp instability actually effecting image quality is detected.

It is a feature of the present invention that two detectors are positioned at predetermined lateral distances along an expected illumination intensity profile of an illumination field.

It is another feature of the present invention that a ratio of the output of the two detectors is calculated and used to indicate lamp stability.

These and other objects, advantages, and features will become readily apparent in view of the following detailed description.

DETAILED DESCRIPTION OF THE PREFERRED EMBODIMENTS

Figure 1:
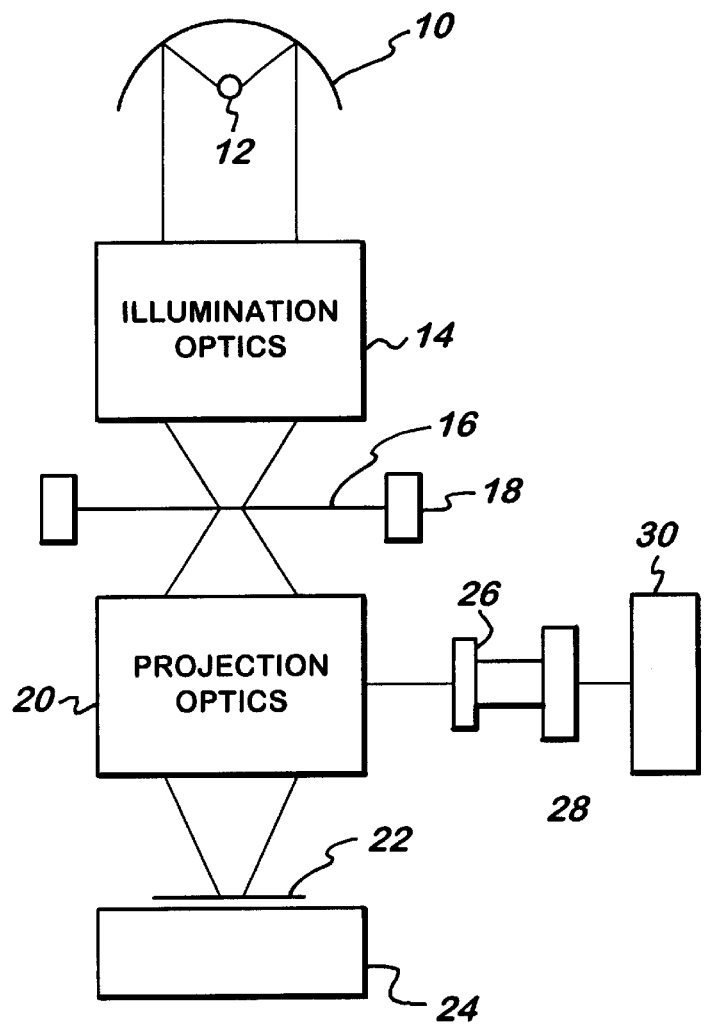
FIG. 1 is a schematic diagram illustrating a microlithography system utilizing the present invention.

FIG. 1 schematically illustrates a microlithographic or photolithographic device utilizing the present invention. A lamp 10, which may be a mercury xenon short arc lamp has an arc 12 which is used to provide electromagnetic radiation or illumination to illumination optics 14. Illumination optics 14 conditions the illumination into a predetermined illumination field having a lateral illumination intensity profile. The illumination field is used to projected an image of reticle 16, which is attached to a reticle stage 18. The projection optics 20 projects the image of the reticle 16 onto a photosensitive resist covered wafer 22 at a wafer plane. The photosensitive resist covered wafer 22 is placed on a wafer stage 24. In a scanning photolithography system, the reticle stage 18 and wafer stage 24 are moved together in synchronization. Preferably, projection optics 20 also provide a reduction ratio. A portion of the illumination field forms an image plane at the wafer plane and is conjugated to detector 26. Detector 26 may be a detector array having at least two separate detectors. The output of the two detectors is provided to a ratio calculator 28. The output of the ratio calculator 28 is provided to a system control 30. It is preferable that the detector 26 be positioned at a conjugate to the wafer plane, however, the detector 26 may also be positioned near the reticle or the wafer, depending upon the structure of the photolithography system. It is often desirable to conjugate the image of the illumination field or image plane at the wafer to a more desirable or convenient location where the detector 26 may be more suitably located.

Figure 2:
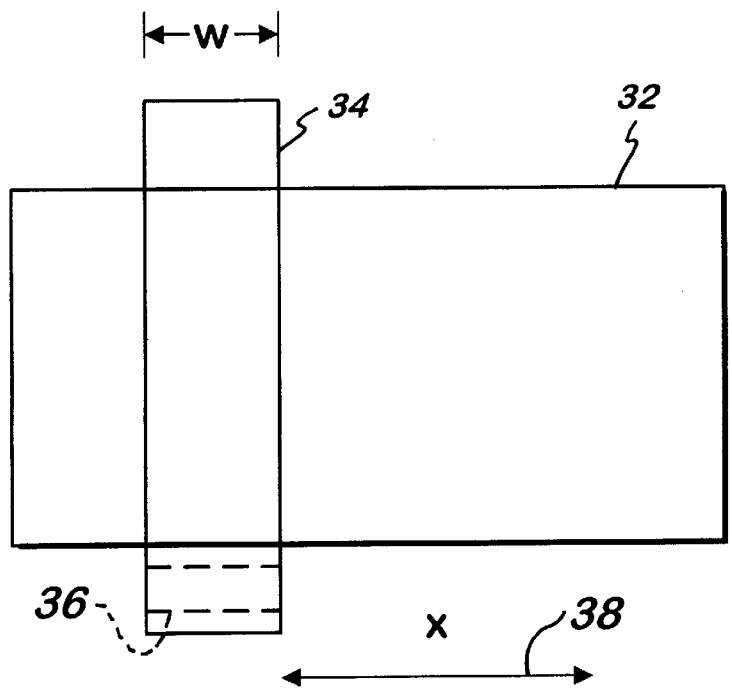
FIG. 2 is a schematic diagram illustrating a rectangular illumination field at a wafer plane or its conjugate.

FIG. 2 more clearly illustrates a rectangular illumination field 34 created by the lamp 10 and the illumination optics 14, illustrated in FIG. 1. The illumination field 34 has a lateral width w and a longitudinal length. This illumination field 34 projects the image of a reticle onto a photosensitive resist covered substrate or wafer. Rectangle 34 represents a portion of the wafer plane on which the image of the reticle is to be reproduced. In a scanning photolithography system, a portion of a wafer 32 is scanned in the x direction, illustrated by arrow 38, across the illumination field 34 simultaneously with the reticle so as to fully expose the entire wafer. A lateral portion of the illumination field 36 at the wafer plane is either directly or indirectly conjugated to a detector for detecting an illumination intensity at selected locations along the illumination intensity profile created by the lamp 10 and illumination optics 14, illustrated in FIG. 1.

Figure 3:
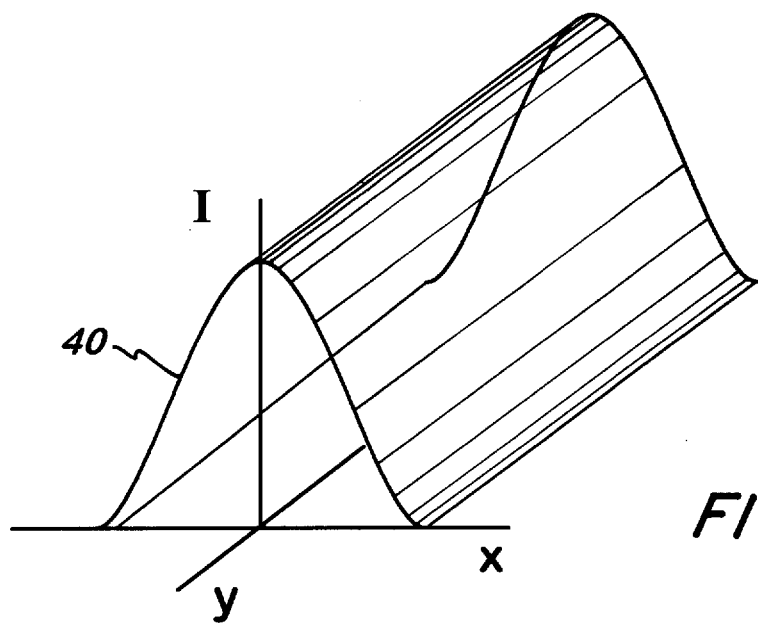
FIG. 3 is a perspective drawing illustrating an illumination intensity profile of a rectangular illumination field.

FIG. 3 is a perspective illustration illustrating the preferred or expected illumination intensity profile that is normally obtained from the lamp 10 and illumination optics 14, illustrated in FIG. 1. Wave form 40 represents the illumination intensity profile. The illumination intensity profile increases and decreases along the x axis laterally across the illumination slot or rectangular illumination field. Longitudinally along the illumination field or slot, the illumination intensity is relatively uniform. The x axis represents the lateral dimension and the y axis represents the longitudinal dimension, with the I axis representing illumination intensity. This preferred illumination intensity profile, illustrated in FIG. 3, is desired to obtain a preferred exposure, and therefore better product quality or wafer production with higher yields.

Figure 4A:
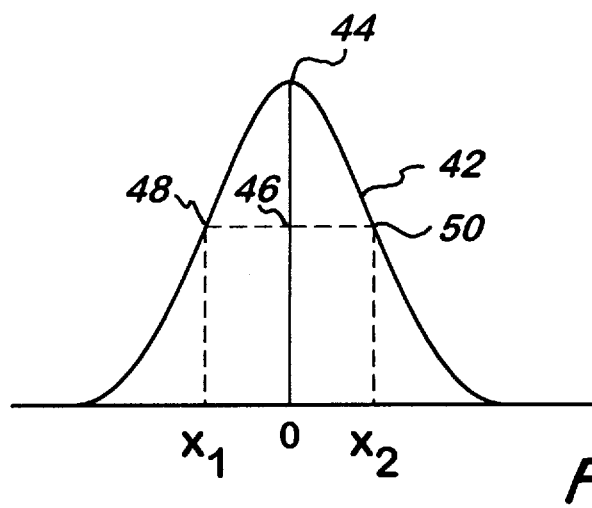
FIG. 4A is a graph illustrating the illumination intensity profile and detector positions.

FIG. 4A is a graph more clearly illustrating the illumination intensity profile laterally in the x direction, as illustrated in FIG. 3. Wave form 42 illustrates the desired or expected illumination intensity profile for a stable lamp. The illumination intensity profile has a maximum illumination intensity at point 44. Point 46 represents an illumination intensity of approximately one-half of the maximum illumination intensity at point 44. Point 48 represents the illumination intensity at a predetermined lateral location $x_1$ in the illumination field. Point 50 represents the illumination intensity at a second predetermined lateral location $x_2$ in the illumination field. At these approximately half intensity locations, points 48 and 50, the slope of the wave form 42 is relatively steep or large. The slope is generally the largest at these half intensity locations, points 48 and 50. Additionally, the ratio of the illumination intensity at points 48 and 50 is approximately equal, and therefore one or unity. The slope at points 48 and 50, being relatively steep, results in the ratio being especially sensitive to changes or lateral shifting of the illumination intensity profile. Therefore, the preferred location of detectors positioned laterally along the illumination intensity profile is at locations were the slope of the expected illumination intensity profile is steep or large. This increases sensitivity in detecting any lamp instability.

Figure 4B:
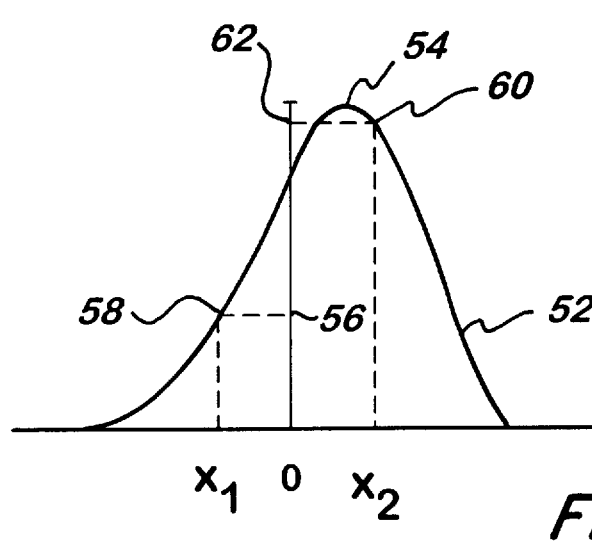
FIG. 4B is a graph illustrating the illumination intensity profile of an unstable lamp.

FIG. 4B illustrates an illumination intensity profile that may result from an unstable lamp. The illumination intensity profile is changed or shifted as a result of lamp flicker or other undesirable lamp properties. Accordingly, this change in illumination intensity profile is undesirable and may adversely effect image quality. Wave form 52 represents the illumination intensity profile laterally across the illumination field width in the x direction, as illustrated in FIG. 3. Point 54 represents the maximum intensity of the changed or shifted illumination intensity profile, which is no longer symmetrically positioned between the two lateral locations $x_1$ and $x_2$ along the x axis. Point 58 represents the illumination intensity at lateral location $X_1$. Point 60 represents the illumination intensity at lateral location $X_2$. The illumination intensity at point 58 has a value identified at point 56, and the illumination intensity at point 60 has a value identified at point 62. The values of illumination intensity at points 56 and 62, no longer being equal, clearly have a ratio other than one.

Figure 5:
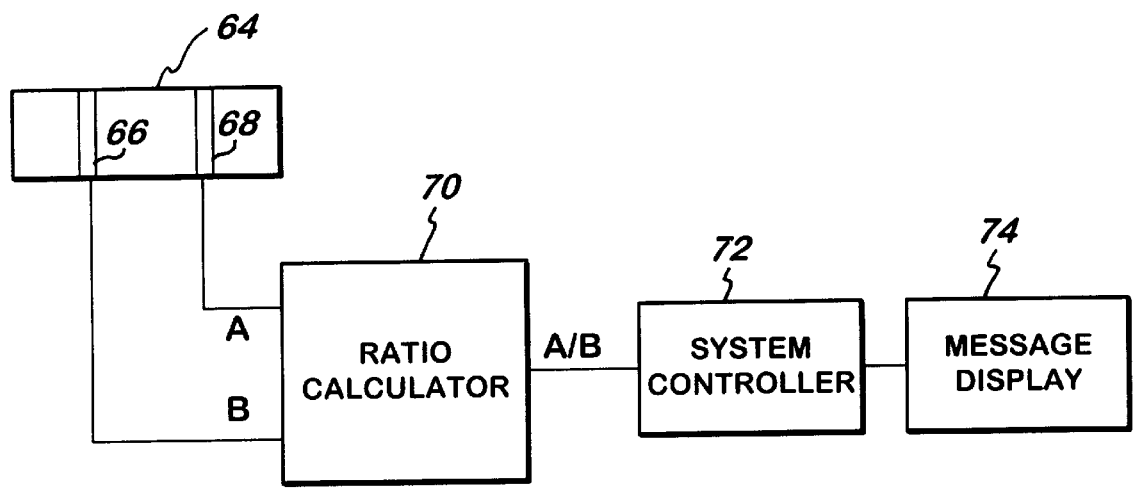
FIG. 5 is a block diagram illustrating the present invention.

FIG. 5 is a block diagram illustrating rating the present invention. Detector array 64 is positioned as illustrated in the previous figures to receive a portion of the illumination field over a lateral dimension. Detector array 64 may be an array of any size; for example a 1×35 detector array, however, only two array elements positioned at predetermined lateral distances along the width of the illumination intensity profile need be utilized. For example, a first detector 66 may be positioned at a first lateral position, corresponding to position $x_1$ in FIGS. 4A and 4B, and a second detector 68 may be positioned at a second lateral position, corresponding to position $x_2$ in FIGS. 4A and 4B. Accordingly, the first and second detectors 66 and 68 receive illumination intensity from each side of the expected maximum illumination intensity at a central point. Therefore, the detectors 56 and 68 are equally spaced from the expected maximum illumination intensity location of the illumination intensity profile. Preferably, these detectors are positioned to receive approximately one-half of the expected maximum illumination intensity in the illumination intensity profile, or a location where the slope of the illumination intensity profile is large or relatively steep, and preferably the largest or steepest. This maximizes the sensitivity of the present invention in detecting any changes in the illumination intensity profile. Detector 56 has an output signal B which is representative of the illumination intensity at its location, and detector 68 has an output signal A which is representative of the illumination intensity at its location. Output signals A and B are input into a ratio calculator 70. The ratio calculator 70 calculates the ratio of the signals A and B. This ratio is input into a system controller 72. The system controller 72 is pre-programmed with a predetermined ratio range which is acceptable. Should the calculated ratio fall outside this predetermined range, it is an indication that the detected instability of the lamp could affect image quality, and therefore the quality of the semiconductor device being produced. The system controller 72 then provides a signal to message display 74 which provides a warning message to an operator to stop processing, to check, or replace the lamp. Alternatively, the system controller 72 may shut down the processing automatically should the ratio from ratio calculator 70 be out of a predetermined acceptable range.

Figure 6:
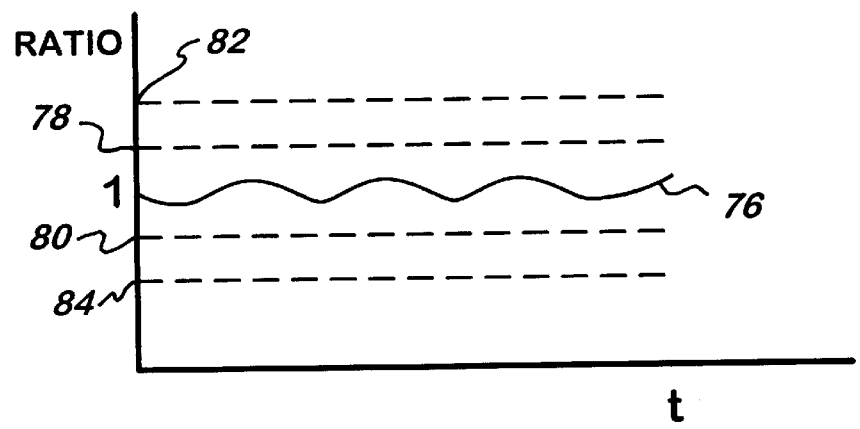
FIG. 6 is a graph illustrating the ratio output of the present invention.

FIG. 6 graphically illustrates the output of ratio calculator 70. Wave form 76 represents the ratio value over time. This ratio value approaches approximately one, but will tend to deviate from one depending on lamp stability. A warning upper limit 78 and a warning lower limit 80 may be determined based upon a predetermined or experimentally determined limit, at which point image quality may be effected. When the ratio value presented by wave form 76 falls above or below the warning upper or lower limits 78 and 80, a message or signal may be provided to a user to check or replace the lamp. Additionally, an upper shutdown limit 82 and a lower shutdown limit 84 may be provided to automatically shut down the processing, should the ratio represented by wave form 76 reach the predetermined shutdown limits 82 and 84.

Figure 7:
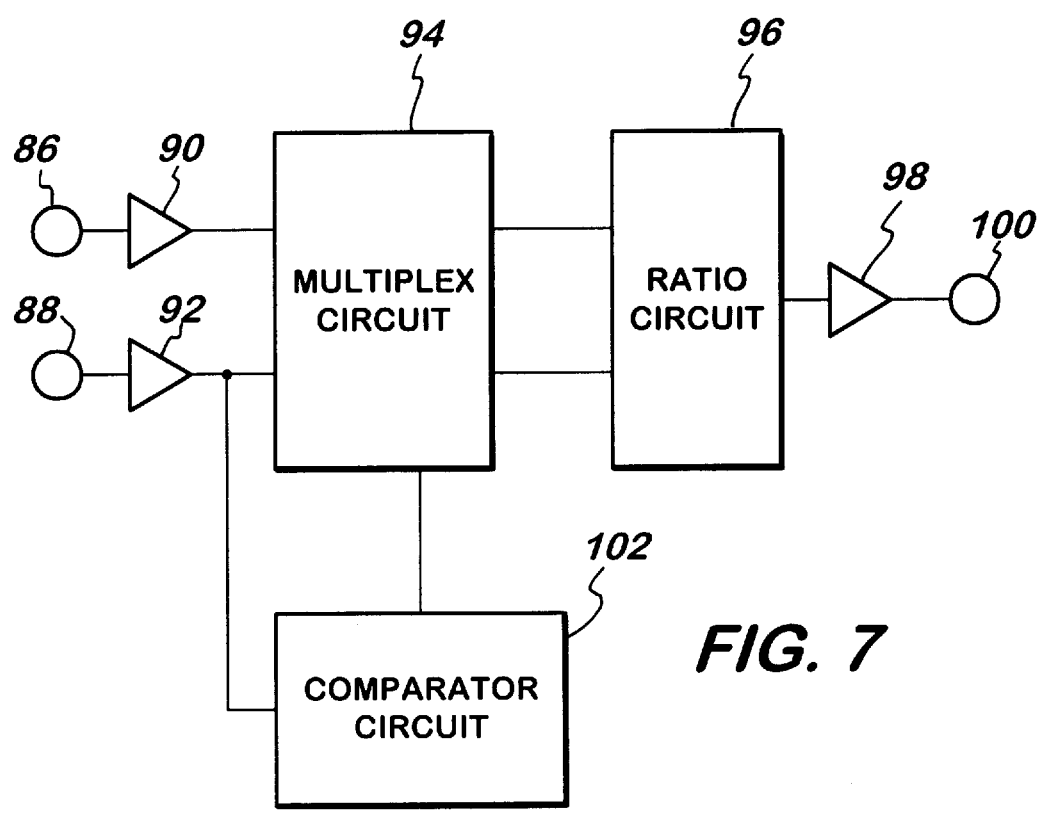
FIG. 7 is a block diagram illustrating generally a circuit configuration utilized in the present invention.

FIG. 7 illustrates a block diagram of a circuit that may be used in practicing the present invention. Input 86 receives a signal from one of the detectors, for example detector 66 illustrated in FIG. 5. Input 88 receives a signal from another detector, such as detector 68 illustrated in FIG. 5. These signals from the detectors are amplified by amplifiers 90 and 92. The output of amplifiers 90 and 92 are fed into multiplex circuit 94. The output signal of the multiplex circuit 94 is representative of the intensity of the illumination profile at each respective detector and is input into ratio circuit 96. The output of the ratio circuit 96 is fed into an amplifier 98, which then provides an output at 100. The output at 100 is a signal representative of the ratio of the signals representing the intensity of the illumination intensity profile at the detectors. The output at 100 is then provided to a system controller, such as that illustrated in FIG. 5. A comparator circuit 102 may also be provided. The comparator circuit 102 receives input from the amplified signal of one of the detectors in order to prevent a ratio calculation when there is no signal, such as when a shutter is closed in the illumination system so that no illumination is provided to the detectors. Accordingly, the comparator circuit 102 then instructs the multiplex circuit 94 not to provide the ratio circuit 96 with signals, preventing the calculation of a ratio which could result in an erroneous signal being provided at output 100. It should be appreciated that FIG. 7 only illustrates in block diagram form a circuit that may be used to calculate a ratio according to the present invention. Many different specific circuit configurations for calculating a ratio are well known to those skilled in the art and may be used in practicing the present innovation. The present invention should not be limited to any particular circuit configuration for calculating a ratio from the output of two detectors.

Accordingly, it should be appreciated that the present invention in selecting detector positions along a lateral dimension of an illumination intensity profile and calculating the ratios of the detected illumination intensity provides a simple and accurate device for monitoring in real time stability of a short arc lamp used in a photolithographic device. This greatly contributes to improved wafer processing and prevents undesirable down time or continued processing when image quality due to an unstable lamp may be less than desired. Additionally, by detecting the illumination intensity profile at a conjugate to the wafer plane and calculating a ratio, many false readings of lamp instability are avoided. A more accurate determination of lamp instability and any potential effect on image quality is quickly and easily obtained with the present invention. This greatly improves system performance, including though put and yield.

Accordingly, while the present invention has been described with respect to the preferred embodiments, it should be obvious to those skilled in the art that various modifications may be made without departing from the spirit and scope of this invention.

What is claimed is:

1. A lamp instability detecting system comprising:
   a first detectors placed at a first predetermined lateral position in an illumination field at an image plane, said first detector having a first output representative of a first illumination intensity;
   a second detector placed at a second predetermined lateral position in the illumination field at the image plane, said second detector having a second output representative of a second illumination intensity; and
   calculation means, coupled to said first and second detectors, for calculating a relationship between the first output and the second output, whereby lamp instability is detected.

2. A lamp instability detecting system as in claim 1 wherein:
   the relationship between the first output and the second output is a ratio.

3. A lamp instability detecting system as in claim 1 wherein:
   the first predetermined lateral position and the second predetermined lateral position are equidistant from an expected maximum illumination intensity location.

4. A lamp instability detecting system as in claim 1 wherein:
   the first predetermined lateral position and the second predetermined lateral position are located on each side of an expected maximum illumination intensity location at an expected substantially half illumination intensity location.

5. A lamp instability detecting system as in claim 2 further comprising:
   system controller means, coupled to said calculation means, for determining if the ratio deviates from a predetermined range.

6. A lamp instability detecting system as in claim 5 further comprising:
   a display, wherein a warning message is displayed when it is determined that the ratio deviates from the predetermined range.

7. A lamp instability detecting system as in claim 5 wherein:
   said system controller means causes processing to stop when it is determined that the ratio deviates from the predetermined range.

8. A lamp stability detecting system comprising:
   a detector array, said detector array positioned across an illumination field, said detector array having a first detector and a second detector, said first and second detectors spaced a predetermined distance apart, the first and second detectors each providing a detector signal representative of an intensity of the illumination field at a location of the first and second detectors respectfully;
   ratio means, coupled to said first and second detectors, for calculating a ratio of the detector signals provided by the first and second detectors; and
   controller means, receiving a ratio signal representative of the ratio, for determining if the ratio falls outside a predetermined range,
   whereby lamp stability is determined.

9. A lamp stability detecting system as in claim 8 wherein:
   said detector array is placed at a conjugate to an image plane.

10. A lamp stability detecting system as in claim 8 wherein:
    the predetermined distance apart is centered about a location of an expected maximum illumination intensity of the illumination field.

11. A lamp stability detecting system as in claim 10 wherein:
    the predetermined distance apart positions said first and second detectors at locations having an illumination intensity substantially one half of the expected maximum illumination intensity.

12. A lamp stability detecting system as in claim 8 further comprising:
    a display coupled to said controller means, wherein a warning message is displayed when the ratio falls outside of the predetermined range.

13. A lamp stability detecting system as in claim 8 wherein:
    said control means stops production of parts when the ratio falls outside of the predetermined range.

14. An illumination stability detection system as used in photolithography for the manufacture of semiconductor devises comprising:

an arc lamp;

illumination optics collecting electromagnetic radiation from said arc lamp, said illumination optics forming a rectangular illumination field, the rectangular illumination field having a lateral width and a predetermined lateral illumination intensity profile;

projection optics, said projection optics projecting an image of a reticle onto a wafer at a wafer plane;

a first detector positioned at a conjugate to the wafer plane at a first predetermined distance along the width of the rectangular illumination field, said first detector providing a first signal representative of a first illumination intensity at the first predetermined distance;

a second detector positioned at the conjugate to the wafer plane at a second predetermined distance along the width of the rectangular illumination field, said second detector providing a second signal representative of a second illumination intensity at the second predetermined distance;

a ratio circuit, said ratio circuit coupled to the first and second detectors and providing a ratio output of the first signal and the second signal;

a system controller coupled to said ratio circuit, said system controller detecting when the ratio output falls outside of a predetermined upper and lower limit; and a display coupled to said system controller, said display displaying a message when the ratio output falls outside either of the predetermined upper and lower limits, whereby lamp instability is detected improving system performance.

15. An illumination instability detection system as in claim 14 wherein:

the first predetermined distance and the second predetermined distance are equidistant from an expected maximum intensity of the illumination field.

16. An illumination instability detection system as in claim 15 wherein:

the first predetermined distance and the second predetermined distance is equal to a location corresponding to a substantially maximum slope of a lateral illumination intensity profile of the illumination field.

17. An illumination stability detection system as used in a scanning photolithographic device used for the manufacture of semiconductor devises comprising:

an arc lamp;

illumination optics collecting electromagnetic radiation from said arc lamp, said illumination optics forming a rectangular illumination field, the rectangular illumination field having a lateral width and a predetermined lateral illumination intensity profile;

projection optics, said projection optics projecting an image of a reticle onto a wafer at a wafer plane;

a first detector positioned at a conjugate to the wafer plane at a first predetermined lateral distance from an expected maximum illumination intensity location at a first location along the width of the rectangular illumination field corresponding to a first expected maximum slope location of the illumination intensity profile, said first detector providing a first signal representative of a first illumination intensity at the first location;

a second detector positioned at the conjugate to the wafer plane at a second predetermined lateral distance from the expected maximum illumination intensity location at a second location along the width of the rectangular illumination field corresponding to a second expected maximum slope location of the illumination intensity profile, said second detector providing a second signal representative of a second illumination intensity at the second location;

a multiplex circuit coupled to said first and second detectors, said multiplex circuit having a first and second output corresponding to the first and second signals representative of the first and second illumination intensity at the first and second locations respectfully;

a ratio circuit, said ratio circuit coupled to the first and second outputs of said multiplex circuit and providing a ratio output of the first and second outputs of said multiplex circuit;

a comparator circuit coupled to one of said first and second detectors and said multiplex circuit, said comparator circuit preventing said multiplex circuit from providing said ratio circuit with a signal when no illumination is received by the one of said first and second detectors, whereby an erroneous ratio signal is prevented;

a system controller coupled to said ratio circuit, said system controller detecting when the ratio output falls outside of a predetermined upper and lower limit; and a display coupled to said system controller, said display displaying a message when the ratio output falls outside either of the predetermined upper and lower limits, whereby lamp instability is detected improving system performance.

* * * * *